United States Patent [19]
Gagnon

[11] Patent Number: 5,859,387
[45] Date of Patent: Jan. 12, 1999

[54] SEMICONDUCTOR DEVICE LEADFRAME DIE ATTACH PAD HAVING A RAISED BOND PAD

[75] Inventor: Jay J Gagnon, Holden, Mass.

[73] Assignee: Allegro MicroSystems, Inc., Worcester, Mass.

[21] Appl. No.: 758,403

[22] Filed: Nov. 29, 1996

[51] Int. Cl.⁶ .................................................. H01L 23/28
[52] U.S. Cl. ......................... 174/52.2; 257/676; 257/693
[58] Field of Search ........................ 174/52.4; 257/666, 257/670, 672, 674, 676, 678, 692, 693; 361/723, 820

[56] References Cited

U.S. PATENT DOCUMENTS

| | | | |
|---|---|---|---|
| 3,930,114 | 12/1975 | Hodge | 174/52.4 |
| 4,751,611 | 6/1988 | Arai et al. | 361/813 |
| 4,916,506 | 4/1990 | Gagnon | 257/675 |
| 4,994,895 | 2/1991 | Matsuzaki et al. | 257/791 |
| 5,289,344 | 2/1994 | Gagnon et al. | 361/712 |
| 5,291,059 | 3/1994 | Ishituka et al. | 257/666 |
| 5,332,864 | 7/1994 | Liang et al. | 174/52.4 |
| 5,389,818 | 2/1995 | Inoue et al. | 257/676 |
| 5,420,459 | 5/1995 | Kozono | 257/666 |
| 5,437,915 | 8/1995 | Nishimura et al. | 428/209 |
| 5,479,050 | 12/1995 | Pritchard et al. | 257/670 |
| 5,530,281 | 6/1996 | Groover | 257/666 |
| 5,661,338 | 8/1997 | Yoo et al. | 257/676 |

*Primary Examiner*—Bot L. Ledynh
*Assistant Examiner*—Hung V. Ngo
*Attorney, Agent, or Firm*—David G. Rasmussen; Arthur K. Hooks; Vincent Sweeney

[57] ABSTRACT

A semiconductor device includes a lead frame assembly having a die attach pad with a die secured by a die bonding material. A portion of the die bonding material may flow out from between the die and the die attach pad to form a squash out layer. A raised bond pad is at least partially in the squash out layer area and extends upward from said die attach pad sufficient to be above the squash out layer. A bond wire has one end secured to a ground terminal on the die and the other end to the raised bond pad. The whole structure is encapsulated in a plastic package.

10 Claims, 4 Drawing Sheets

SEMICONDUCTOR DEVICE LEADFRAME DIE ATTACH PAD HAVING A RAISED BOND PAD

BACKGROUND OF INVENTION

1. Field of the Invention

This invention relates to a semiconductor device having a lead frame including a die attach pad with a contiguous lead which serves as a ground lead and at times a heat sink. More particularly, the invention relates to ground bond pads on the die attach pad.

2. Description of the Related Art

In prior art packages, especially those encapsulating semiconductor device die for logic, sensing and power devices, it is known to provide a ground terminal on the top surface of the die which is connected electrically through a bond wire to a lead frame die attach pad and/or an external lead. A ground lead contiguous with the die attach pad will may conduct heat from the bottom of the die to a printed wire board. Thus, the ground lead may serve the dual purposes of removing heat and also providing an electrical ground connection to the terminal at the top of the die.

It has been discovered that semiconductor device packages having a die attach pad with a contiguous ground lead that serves as a heat-sink and that has a bond wire from the top of the die to the periphery of the die attach pad, are prone to failure at a high rate after several hundred temperature cycles.

Even when the temperature coefficient of expansion of the lead frame metal and that of the solid resin body are nearly the same, changes in temperature of the resin- encapsulated metal lead frame parts occur faster than changes in the temperature of the solid resin body. This results in physical movement and displacement between peripheral parts of the lead frame die-attach pad and the surrounding bonded resin. This displacement is most severe at the joint of the die-attach pad and the bond wire, and catastrophic failure of that joint occurs after repeated temperature cycles.

A second problem occurs if the bond wire attaches to the die attach pad near the base of the die. This means that the wire must approach the bond at or near a right angle. This right angle approach amplifies accumulation of cycle induced stress and thereby encourages failure.

Both of these problems have been addressed in U.S. Pat. No. 5,289,344, hereby incorporated by reference. FIG. 1 of that patent discloses the use of an elevated bond pad wing which is largely encased by plastic and is not subject to the destructive forces of thermal cycling because there is little movement between metal and the encapsulating resin. Thus, there is little or no joint fatigue between the bond wire and bond pad wing after multiple temperature cycles.

In addition, the elevated bond pad wing is in the same plane as the top of the die thus allowing the bond wire to approach the bond pad wing at a very low (small) angle. This small approach angle minimizes accumulation of cycle induced stress and is less prone to failure.

Other semiconductor device packages such as the SOT-89 (TO-243) have a standard size. In order to accommodate larger die the die attach pad must be larger. This usually results in less space available on the die attach pad to place a ground bond pad. However, the same problems with thermal cycling and wire bond angle to the bond pad still remain.

What is needed is a semiconductor device package which will accommodate large die and still have a bond pad structure usable in small areas of a die attach pad which solve the problems of the prior art.

SUMMARY OF THE INVENTION

The present invention is a bond pad structure for use in semiconductor device packages having increased size die and die attach pads where only a small amount of space is available to attach a ground bond.

A semiconductor device includes a lead frame assembly having a die attach pad with a die secured by a die bonding material. A portion of the die bonding material may flow out from between the die and the die attach pad to form an area of a squash out layer where a bond pad may not be placed. A raised bond pad is at least partially in the squash out layer and extends upward from the die attach pad above the squash out layer thus not being affected and allowing a bond pad to be placed close to the die. A bond wire has one end secured to a ground terminal on the die and the other end to the raised bond pad. The whole structure is encapsulated in a plastic package.

An second inventive feature is that the raised bond pad extends upward to reduce the angle at which the bond wire attaches to the raised bond pad so that it creates a secure bond attachment resistant to thermal cycling stresses.

Still another inventive feature is that the raised bond pad is secured to the die attach pad on two sides so that it is self supporting and able to be wire bonded without support fixtures.

Still another inventive feature is that the raised bond pad is enclosed sufficiently by the plastic of the package that little displacement occurs between the raised bond pad and plastic package during thermal cycling thus preventing thermal stress where the bond wire is secured to the raised bond pad.

DETAILED DESCRIPTION OF THE INVENTION

Figure 1:
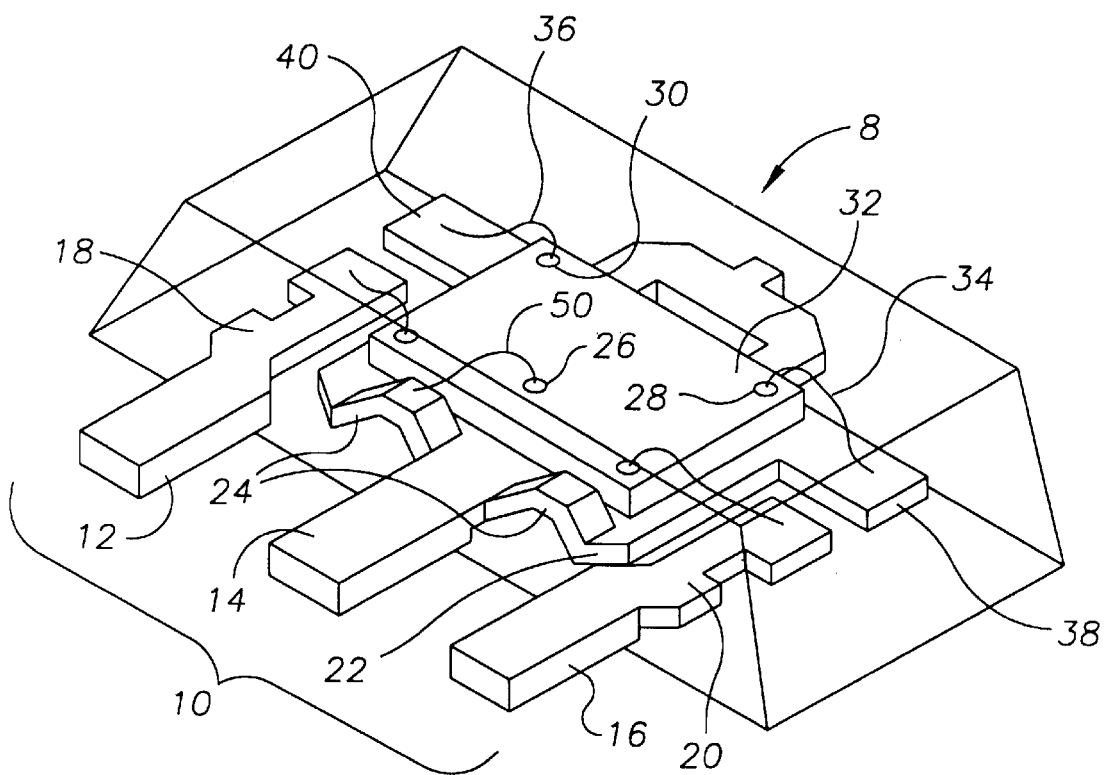
FIG. 1 is a perspective top view of the semiconductor device package of the invention showing the internal lead frame and die structure.

FIG. 1 shows a semiconductor device package 8 having a dual gauge metal lead frame which will accommodate an increased size die and die attach pad. The semiconductor device may be a discrete device or preferably an integrated circuit. The metal lead frame 10 has package leads 12, 14, 16, inner bond fingers 18,20, and die attach pad 22. The metal package leads have a top to bottom thickness of 15 mils. The inner bond fingers 18,20, and die attach pad 22 are reduced in thickness to 7.5 mils. This reduction in thickness prevents the die attach pad from extending through the bottom of the plastic package and allows all of the die attach pad 22 and inner bond fingers 18,20 to be encapsulated, thus preventing moisture from entering. The reduced metal thickness also allows the die attach pad 22 to be enlarged because it can be spaced closer to inner bond fingers 18,20. Less spacing is needed if thinner lead frame material is used because of the metal cutting and punching technology. However, as the die attach pad and die become larger the space on the die attach pad to locate a ground bond pad becomes more limited. This requires the inventive ground bond pad structure, raised bond pad 24.

Several ground terminals 26,28,30 are shown on the top of die 32. Ground terminals 28,30 have ground bond wires 34,36, respectively, extending down to tabs 38,40 which are extensions of the die attach pad 22. There is room within the SOT 89 package outline to include the tabs which provide sufficient space for the ground bond to be attached in a traditional manner.

Figure 2:
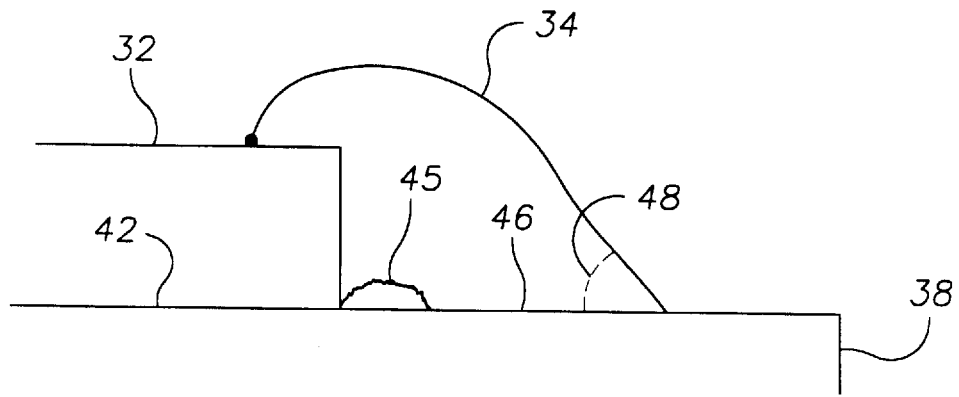
FIG. 2 is an illustrative diagram showing a traditional ground bond connection.

FIG. 2 illustrates the space needed for a traditional bond attachment such as those on tabs 38,40 of FIG. 1. A die bonding material 42, which may be conductive or non-conductive, and for example may be a eutectic such as gold, a solder such as lead/tin, or preferably an adhesive is between tab 38 and die 32. It squeezes out onto the surface of tab 38 forming "squash out" 45, which typically has a specification of 5–10 mils wide. In addition, if an adhesive is used, resins from the adhesive may bleed out and create an additional 5 mil space 46 around the die. The term squash out layer hereinafter is meant to generally include the squash out of an adhesive, the wetting area of a eutectic or solder and/or the resin bleed space 46. The ground bond 34 must be bonded to tab 38 beyond the squash out 45 and the resin bleed space 46. Typically 25 mils of tab 38 area around die 32 is needed to provide an area for a ground bond.

In addition ground bond wire 34 must extend downward from the top of the die to the surface of tab 38. This means that the ground bond must be spaced adequately from the die 32 so that angle 48 between the bond wire 34 and the tab 38 is kept small to maintain reliability in the presence of cyclic thermal expansion stresses. Tab 38 is not formed into a raised wing as in prior art patent U.S. Pat. No. 5,289,344 because the reduced thickness of metal in tab 38 would not be robust enough to resist deforming from handling and processing.

Looking again at FIG. 1, ground terminal 26 is at the front of the die where there is no room to provide a tab extension of the die attach pad 22 to allow for a traditional bond attachment. In addition, it is not feasible to extend a bond wire from terminal 26 to either of tabs 38,40 because the bond wire will be too long and will risk touching the edge of die 32 which could short out the die and/or nick the gold wire and endanger reliability during thermal cycling. In addition, a nicked gold wire adds electrical resistance.

The invention, raised bond pad 24, provides a bond attachment structure which overcomes the space limitations of the traditional bond attachment shown in FIG. 2, solves the problem of displacement of plastic from metal during cyclical thermal expansion, elevates the bond pad to the same plane as the top of the die, and provides a secure bond pad.

Figure 3:
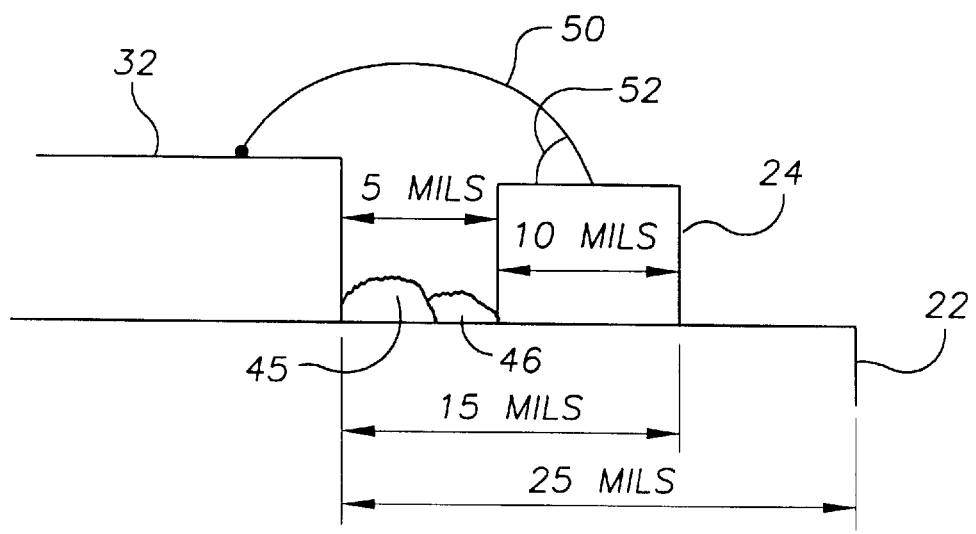
FIG. 3 is an illustrative diagram showing a die and die attach pad having an inventive raised bond pad.

FIG. 3 shows how the raised bond pad 24 overcomes space limitations on the die attach pad 22. The edge of raised bond pad 24 is positioned 5 mils horizontally from the edge of die 32. The raised wire bond pad 24 is above squash out 45 and resin bleed space 46 (i.e. collectively a first area) and is not affected by them. The raised bond pad 24 is 10 mils wide which means that only 15 mils of space on the die attach pad are used rather than the 25 mils required for the ground bond as shown in FIG. 2. The space needed between the edge of the die 32 and the edge of die attach pad 22 to provide a contact point for the bond wire 34 is reduced. This allows raised bond pad 24 to be placed on a die attach pad where space is limited and the traditional bond wire methods as shown in FIG. 2 may not be used.

Because the raised bond pad 24 is approximately in the same plane as the top of the die the bond wire 50 forms a small angle 52 with the surface of raised bond pad 24 thus forming a more secure bond against cyclic thermal expansion stresses.

Referring back to FIG. 1, raised bond pad 24 is encased in plastic thus minimizing movement between the encapsulating resin and the metal during thermal cycling which reduces stress on a wire bond.

In addition, raised bond pad 24 is supported by the die attach pad 22 on both sides of the bond pad thus being self supporting and able to be wire bonded with out support fixtures.

Figure 4:
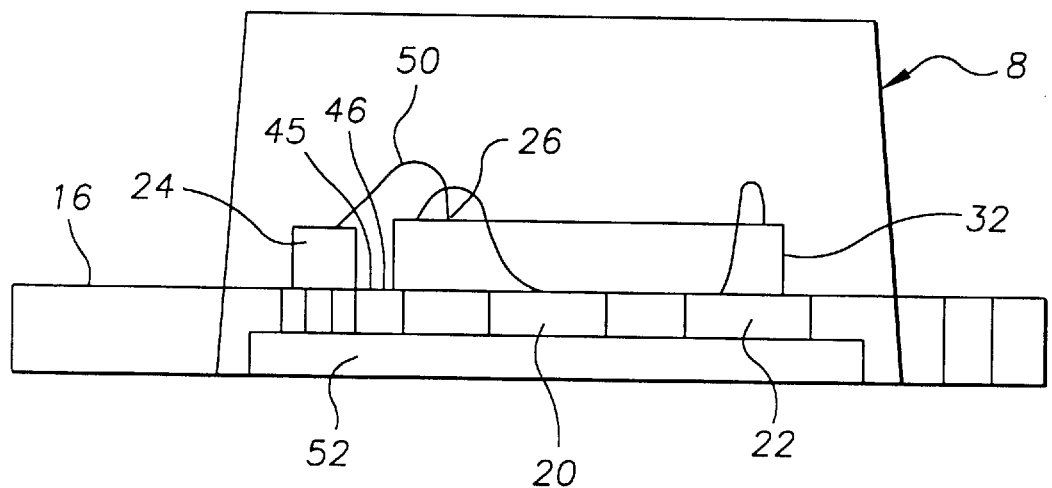
FIG. 4 shows a cutaway side view of the semiconductor device package, lead frame and die of FIG. 1.

FIG. 4 shows a cut away side view of semiconductor device package 8 shown in FIG. 1, with similar elements having similar numbers. Raised bond pad 24 is shown in close proximity to the edge of die 32. Raised bond pad 24 rises above the squash out 45 and resin bleed space 46 between raised bond pad 24 and die 32 and avoids any problems. Bond wire 50 extends from raised bond pad 24 to terminal 26 on die 32.

FIG. 4 also shows the dual gauge metal thickness of the die attach pad 22 and inner bond finger 20. Package lead 16 and inner bond finger 20 are contiguous metal but have different gauge metal thicknesses. As described with respect to FIG. 1, package lead 16 typically has a thickness of 15 mils as it enters the package and is reduced to 7.5 mils as it becomes inner bond finger 20. Package lead 14 (not shown) and die attach pad 22 also have a dual gauge structure. In addition package lead 12 (not shown) and inner bond finger 18 (not shown) have the dual gauge structure.

It should also be noted that the spacing between the die 32 and the raised bond pad 24 is smaller than the space needed to bend an extension of the die attach pad away from die 32 to form an elevated bond pad.

The reason for the dual gauge structure is to make sure the bottom of package 8 covers the under side of the die attach pad 22 and inner bond fingers 18,20. This portion of the package is shown as 52 and prevents moisture from entering the package and electrically insulates die attach pad 22 and inner bond fingers 18,20 from external elements. If die attach pad 22 and inner bond fingers 18,20 were the same gauge metal as package leads 12, 14, 16 they would extend through the bottom of the package 8. At the interface between the metal and the package there would be an opportunity for moisture to enter the package.

Figure 5:
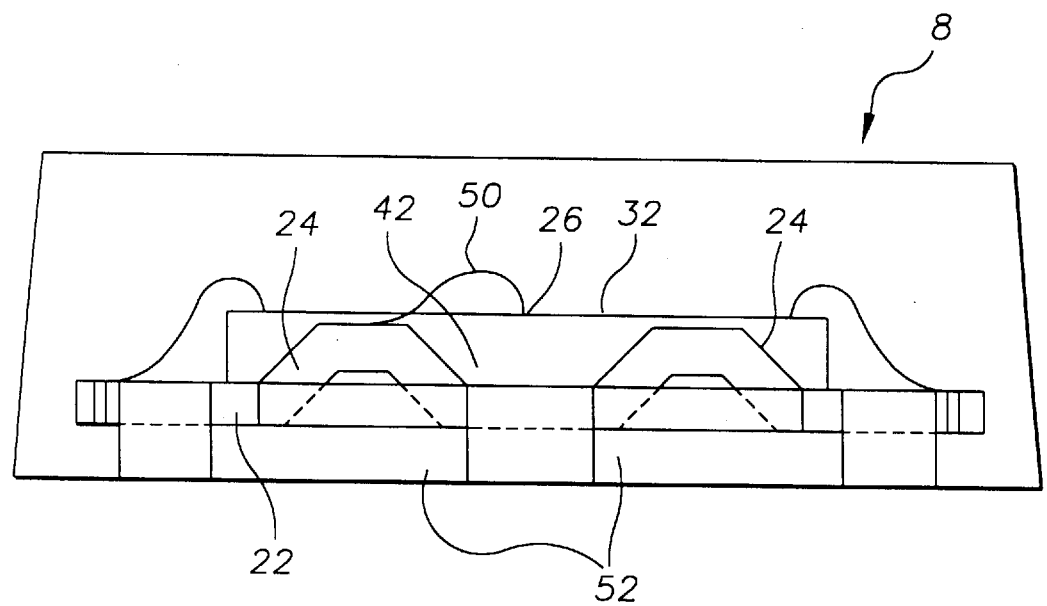
FIG. 5 is a cutaway front view of the semiconductor device package, lead frame and die of FIG. 1.

FIG. 5 shows a front cut away view of the semiconductor device package 8 of FIG. 1 having similar elements and numbering. Die 32 may be from 10–20 mils thick, typically 11–13 mils. Conductive adhesive layer 42 is typically 1 mil thick. The two raised bond pads 24 are shown as slit and formed upward from die attach pad 22. The raised bond pads may be 10 mils high. A mechanical punch slits the die attach pad 10 mils from the front edge of the die attach pad and forms the metal upward into the shape of the raised bond pad 24. The front surface of the raised bond pad shown is the front edge of the die attach pad 22. The back edge of the raised bond pad is where the slit is made. By being formed upward from die attach pad 22 both ends of the raised bond pad 24 are still solidly connected to die attach pad 22 thus providing a very solid "bridge-like" contact point. It would also be within the invention to have just one end formed upward from die attach pad 22. The term forming also covers punching and swaging and other ways of raising the bond pad.

Bond wire 50 extends from terminal 26 on die 32 to the raised bond pad 24. Portion 52 of package 8 is shown covering the bottom surface of die attach pad 22 and inner bond fingers 18,20 (not shown).

Figure 6A:
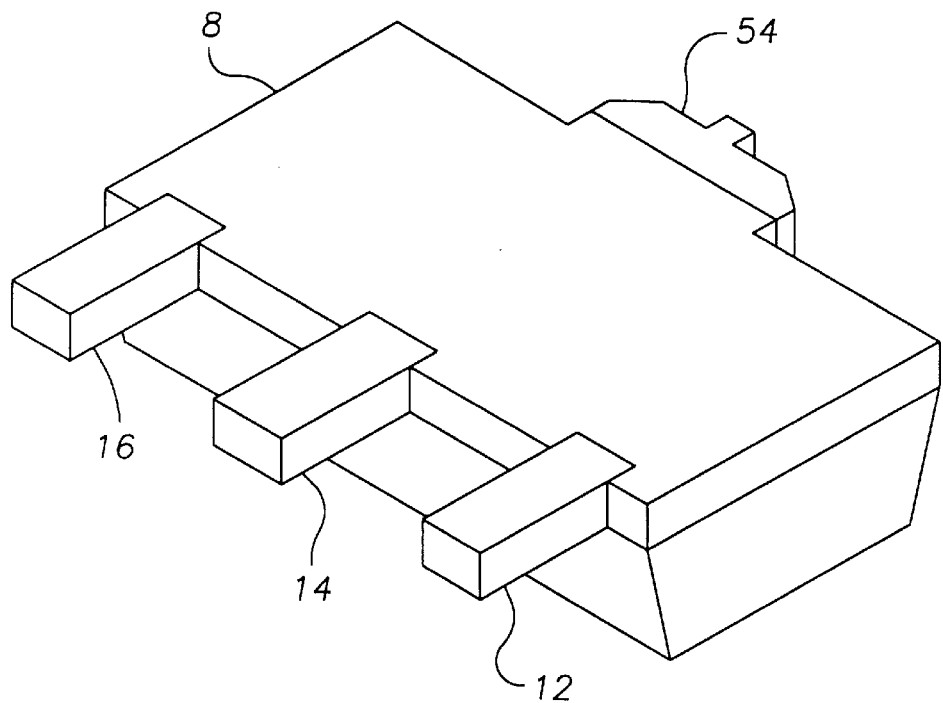
FIGS. 6a, b show a perspective bottom view of the semiconductor device package and the internal dual gauge metal lead frame of FIG. 1.
Figure 6B:
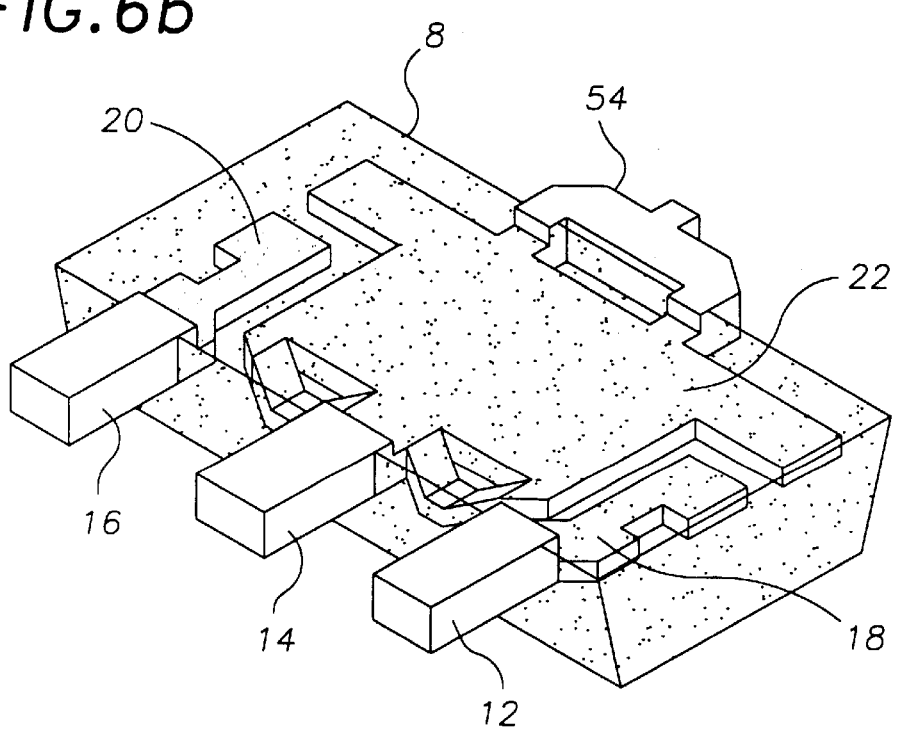

FIG. 6a shows the bottom view of semiconductor device package 8 with package leads 12, 14, 16 and tab 54 extending out of the package. The bottom of the package is solid with no part of the lead frame extending through. FIG. 6b shows package 8 with an internal view of die attach pad 22 and inner bond fingers 18,20 embedded in the package. The bottom surfaces of package leads 12, 14, 16 are flush with package 8. Die attach pad 22 is contiguous metal from package lead 14 but is reduced in thickness so that it is embedded in the plastic. Similarly, inner bond fingers 18,20 are contiguous metal from package leads 12, 16 and are embedded in the plastic. The dual gauge lead frame allows a solid epoxy base of package 26 to prevent moisture from entering the bottom of the package.

While the preferred embodiments of the invention have been shown and described, numerous variations and alternative embodiments will occur to those skilled in the art. Accordingly, it is intended that the invention be limited only in terms of the appended claims.

I claim:

1. A semiconductor device lead frame assembly adapted to be encapsulated by a plastic package, comprising:

a die attach pad, inner bond fingers spaced apart from a die attach pad, said lead frame having dual gauge metal portions, said die attach pad being in a portion with reduced thickness, said die attach pad having its thickness so dimensioned that the bottom of said die attach pad does not extend through said plastic package, said die attach pad adapted to allow a die to be secured to said die attach pad by a die bonding material, a portion of said die bonding material which flows out from between said die and said die attach pad to form a squash out layer covering a first area of said die attach pad, and a raised bond pad, at least partially in said first area, extending upward from said die attach pad sufficient to be above said squash out layer.

2. The semiconductor device lead frame assembly of claim 1, adapted to allow a bond wire to have one end secured to said die and the other end to said raised bond pad, wherein said raised bond pad is so dimensioned upward to reduce the angle at which said bond wire attaches to the raised bond pad so as to create a secure bond attachment resistant to thermal cycling stresses and not contacting the edge of the die.

3. The semiconductor device lead frame assembly of claim 1, wherein said raised bond pad is formed upward from a portion of said die attach pad.

4. The semiconductor device lead frame assembly of claim 3, wherein said portion of said die attach pad is slit and formed upward from said die attach pad.

5. The semiconductor device lead frame assembly of claim 4, wherein two sides of said raised bond pad are secured to said die attach pad and so dimensioned so as to be self supporting and able to be wire bonded without support fixtures.

6. A semiconductor device, comprising:

a plastic package, a lead frame having a die attach pad and inner bond fingers spaced apart from said die attach pad, said lead frame having dual gauge metal portions, said die attach pad being in a portion with reduced thickness, said die attach pad having its thickness so dimensioned that the bottom of said die attach pad does not extend through said plastic package, a die secured to said die attach pad by a die bonding material, a portion of said die bonding material which flows out from between said die and said die attach pad to form a squash out layer covering a first area of said die attach pad, a raised bond pad at least partially in said first area extending upward from said die attach pad sufficient to be above said squash out layer, a bond wire having one end secured to said die and the other end to said raised bond pad, and said plastic package encapsulating said die, die attach pad, raised bond pad and bond wire.

7. The semiconductor device of claim 6, wherein said raised bond pad is so dimensioned upward to reduce the angle at which said bond wire attaches to the raised bond pad so as to create a secure bond attachment resistant to thermal cycling stresses and not contacting the edge of the die.

8. The semiconductor device of claim 7, wherein said raised bond pad is formed upward from a portion of said die attach pad.

9. The semiconductor device of claim 8, wherein said portion is slit and formed upward from said die attach pad.

10. The semiconductor device of claim 9, wherein said raised bond pad is secured to said die attach pad on two sides of said raised bond pad and is so dimensioned to be self supporting and able to be wire bonded without support fixtures.

* * * * *